(12) United States Patent
Gotoh et al.

(10) Patent No.: US 6,259,248 B1
(45) Date of Patent: Jul. 10, 2001

(54) MOTION DETECTION BY PULSE SIGNAL GENERATION

(75) Inventors: Akihiro Gotoh; Shoji Oyama; Tomoaki Ito, all of Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/150,619

(22) Filed: Sep. 10, 1998

(30) Foreign Application Priority Data

Sep. 18, 1997 (JP) .................................................... 9-253805

(51) Int. Cl.$^7$ ....................................................... G01B 7/00
(52) U.S. Cl. ................... 324/207.15; 324/207.13
(58) Field of Search ................... 340/551, 572.1, 340/572.4, 572.6, 572.8; 283/82; 324/207.13, 207.15, 207.17; 307/106; 310/155

(56) References Cited

U.S. PATENT DOCUMENTS

| 4,263,525 | 4/1981 | Lathlaen | 310/155 |
| 5,128,614 | 7/1992 | Schewe | 324/249 |
| 5,181,020 | * | 1/1993 | Furukawa et al. | 340/551 |
| 5,338,036 | * | 8/1994 | Takeuchi et al. | 273/187.2 |

FOREIGN PATENT DOCUMENTS

| 0448114 | 9/1991 | (EP) . |
| 2530036 | 1/1984 | (FR) . |
| 2125970A | * | 3/1984 | (GB) . |

\* cited by examiner

*Primary Examiner*—Christine Oda
*Assistant Examiner*—Henry A. Anderson
(74) *Attorney, Agent, or Firm*—Kanesaka & Takeuchi

(57) ABSTRACT

A pulse signal generator comprises a magnetic element (10) capable of causing a large Barkhausen jump, a detector for detecting a change of magnetic field in the magnetic element, a magnetic field source (30) for magnetizing the magnetic element in a predetermined direction and a permanent magnet (40). The pulse signal generator further comprises an auxiliary member (50) provided such that the magnetic element is flanked between the permanent magnet and the auxiliary member and is in a magnetic field between the permanent magnet and the auxiliary member. The magnetic field varies with movement of an object (60) to be detected with respect to the permanent magnet to produce a magnetic change in the magnetic element which is detected by the detector to produce a pulse.

4 Claims, 5 Drawing Sheets

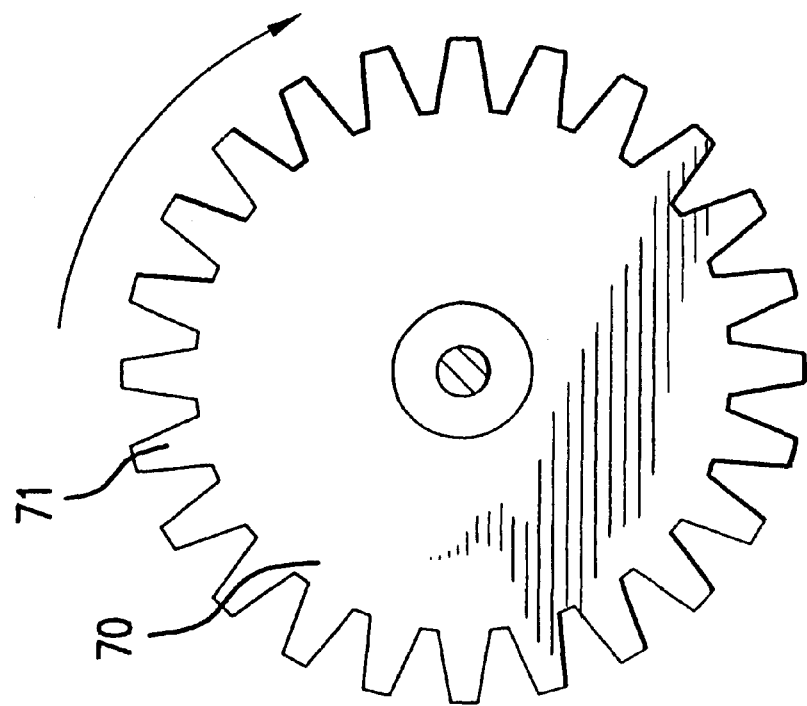
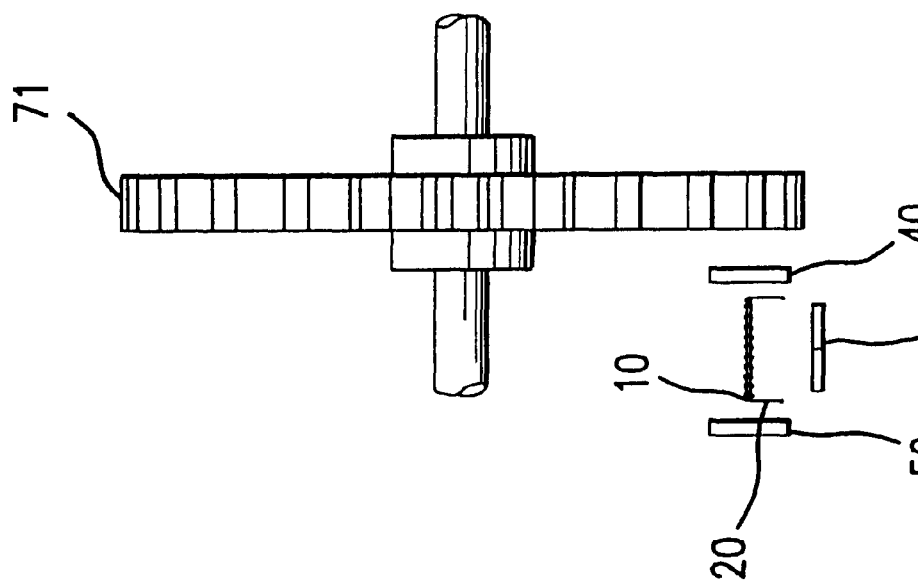

MOTION DETECTION BY PULSE SIGNAL GENERATION

BACKGROUND OF THE INVENTION

1. Field of the Invention

The present invention relates to a method and apparatus for generating a pulse signal.

2. Description of the Related Art

It is necessary to provide a pulse signal in response to the position or speed of a moving object in the field of automatic control or electric or electronic equipment. An electromagnetic pickup is an example of such pulse generators. This electromagnetic pickup comprises a magnetic body, a magnet, and an electrical coil. The magnetic flux varies with movement of the object to be detected to produce a voltage in the electrical coil by the electromagnetic induction. The voltage is used as a pulse signal.

However, the electromagnetic pickup is not suitable in the following field. That is, if the object to be detected moves at very low speeds, the produced voltage is as low as the noise level. If an amplifier is used, the noise is also amplified so that it is necessary to use a filter for removing the noise prior to the amplification. Conversely, the object moves at high speeds, the resulting voltage exceeds the breakdown voltage of the amplifier, thus requiring a limiter. In the case of low speeds, an auxiliary ring is attached to the object to be detected to increase the diameter and thus the peripheral speed. However, this method increases the number of parts and the size of the device. In addition, the timing of rise or fall of the voltage varies with the moving speed of the object to be detected, requiring a complicated signal processor to provide an accurate timing detection. Moreover, the waveform of the voltage varies with the shape of the object to be detected.

Another example is a Hall effect sensor used as a position sensor, angular sensor, or speed sensor. Japanese patent application Kokai No. 2-284082 discloses a Hall effect sensor. This Hall effect sensor comprises a Hall element and a magnet for changing the magnetic flux to the Hall element in response to movement of the object to be detected to provide an electrical signal from the Hall element. However, this type of sensor needs a power source to energize the Hall element. The output electrical signal is a sine wave and cannot produce a sharp pulse signal. If the object to be detected moves at low speeds, the rise of an output voltage is so low that the waveform is truncated. Like the above electromagnetic pickup, it is prone to an external magnetic field and noise and suffers from thermal drift, requiring a complicated processor to provide an accurate detection signal.

Japanese patent application Kokai No. 54-161257 discloses still another type of pulse signal generator. This pulse signal generator comprises a magnetism sensitive element made from a ferromagnetic material so as to have relatively soft and hard portions of magnetic anisotropy, a first magnetic field source for magnetizing the magnetism sensitive element in a positive direction, a second magnetic field source for magnetizing the soft portion of the magnetism sensitive element in a negative direction, a detection coil provided in vicinity of the magnetism sensitive element, and a movable body for interrupting the magnetization of the magnetism sensitive element by the first magnetic field source so that a pulse voltage is produced in the detection coil by the movement of the movable body.

This pulse signal generator is of the powerless type, provides a constant pulse voltage even if the movable object moves at very low speeds, and is resistant against an external magnetic field, thus solving some of the problems of the electromagnetic pickup and Hall effect sensor.

However, this pulse signal generator has the following problems and stands far from practical use. First of all, it needs a movable body with a slit. This movable body cannot be made smaller than the magnet, such as first and second magnetic field sources, and the magnetism sensitive element. Since the slits are provided in the movable body in radial directions, it is necessary to provide a movable body of a large diameter in order to increase the resolution. In addition, the movable body, the magnet, and the magnetism sensitive element should be parallel to each other. The magnet is prone to an external magnetic field or metal to become unstable in operation. It cannot replace the electromagnetic pickup or Hall effect sensor depending on the spacial relationship with the object to be detected. For example, it cannot be disposed to detect directly the teeth of a gear.

SUMMARY OF THE INVENTION

Accordingly, it is an object of the invention to provide a pulse signal generator which solves such problems as described above and are used for move applications than before.

According to an aspect of the invention there is provided a method for generating a pulse signal with a magnetic element capable of causing a large Barkhausen jump, comprising the steps of applying a magnetic field to the magnetic element; providing a permanent magnet in vicinity of the magnetic element so that movement of an object to be detected with respect to the permanent magnet makes a change of magnetic field of the permanent magnet upon the magnetic element; and detecting the change with a detector to produce a pulse.

According to another aspect of the invention there is provided a pulse signal generator, comprising a magnetic element capable of causing a large Barkhausen jump; a detector for detecting a change of magnetic field in the magnetic element; a magnetic field source for magnetizing the magnetic element in a predetermined direction; a permanent magnet; and an auxiliary member provided such that the magnetic element is flanked between the permanent magnet and the auxiliary member and is in a magnetic field between the permanent magnet and the auxiliary member; the magnetic field varying with movement of the object with respect to the permanent magnet to produce a magnetic change in the magnetic element which is detected by the detector to produce a pulse.

According to an embodiment of the invention there is provided a pulse signal generator, which further comprises a second auxiliary member provided to face the auxiliary member; a second magnetic element provided in a magnetic field produced between the auxiliary member and the second auxiliary member and capable of causing a large Barkhausen jump; a second magnetic field source for magnetizing the second magnetic element in a predetermined direction; and a second detector for detecting a change of magnetic field in the second magnetic element.

According to another embodiment of the invention there is provided a pulse signal generator, wherein the second auxiliary member, second magnetic element, second magnetic field source, and second detector are repeated in a subsequent stage to provide a multiple stage structure.

According to still another embodiment of the invention, the permanent magnet is a thin plate type magnet which is magnetized in a thicknesswise direction.

According to yet another embodiment of the invention, the auxiliary member is a thin plate type magnet.

According to another embodiment of the invention, the auxiliary member is a magnetic member.

According to still another embodiment of the invention, the magnetic element is selected from the group consisting of a plate-like element, film-like element, and wire-like element.

BRIEF DESCRIPTION OF THE DRAWINGS

FIG. 5 is a schematic diagram showing an application of the pulse signal generator of FIG. 1.

DESCRIPTION OF THE PREFERRED EMBODIMENTS

Figure 1:
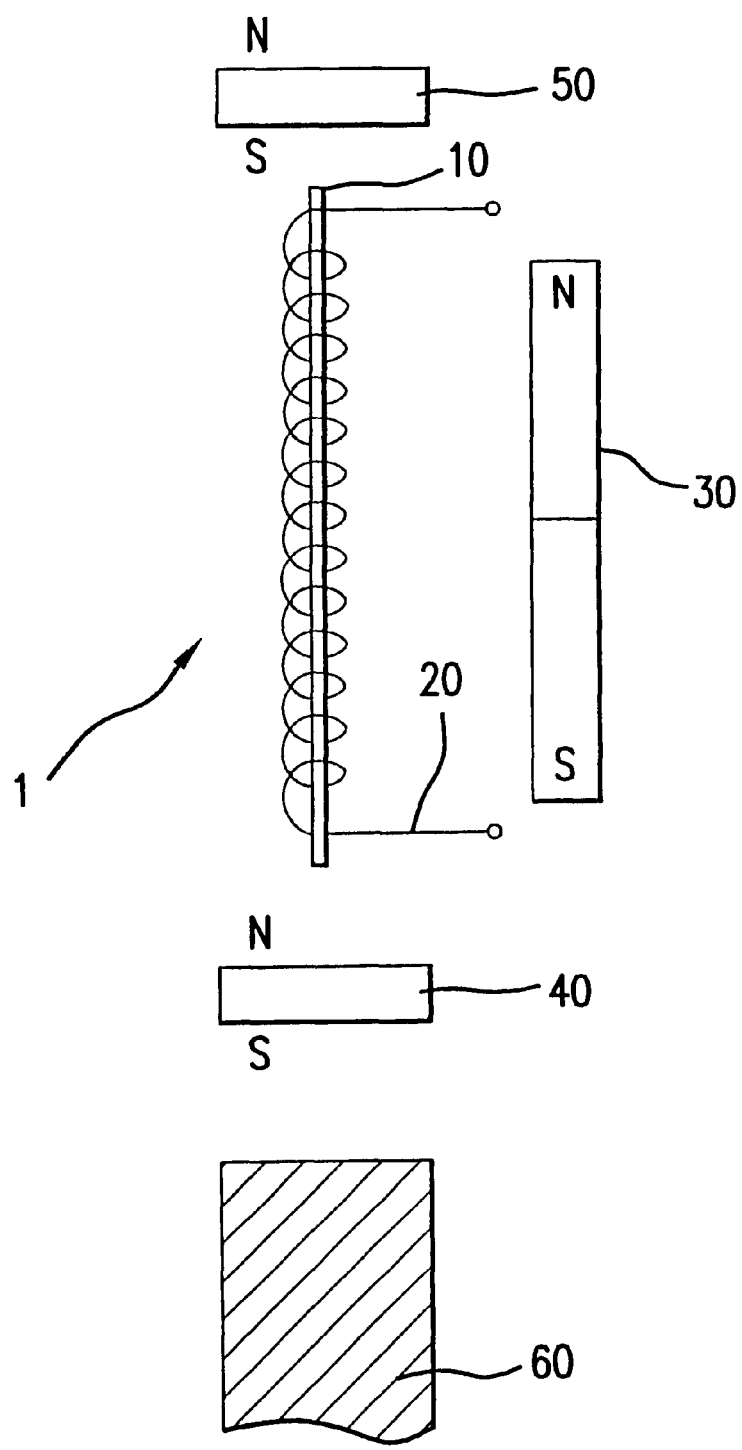
FIG. 1 is a schematic diagram of a pulse signal generator according to an embodiment of the invention.

Before embodiments are described, the "magnetic element capable of causing a large Barkhausen jump" (sometimes simply called "magnetic element") will be described. First of all, the structure and function of a wire-type composite magnetic element will be described. When a ferromagnetic body is drawn to form a wire, the wire has characteristic magnetic properties depending on the alloy composition. When the ferromagnetic wire is twisted, the peripheral and central regions have different magnetic properties because of different amounts of twist. Then, the wire is treated to provide a ferromagnetic wire which retains the magnetic properties. The magnetic direction of the peripheral region is changed by a weak magnetic field while the magnetic direction of the central region is changed by a magnetic field which is stronger than the magnetic field for the peripheral region. That is, the composite magnetic body has two kings of magnetic regions; one which is magnetized easily and the other which is difficult to be magnetized. This composite magnetic wire is uniaxis anisotropic. The peripheral and central regions are called "soft" and "hard" layers, respectively, and the composite magnetic wire is called "wire-type composite magnetic element."

The magnetic directions of the hard and soft layers are not determined initially. When an external field which is sufficiently strong to invert the magnetic direction of the hard layer is applied to the composite magnetic wire in the axial direction, both the soft and hard layers are magnetized in the same magnetic direction. Then, an external magnetic field which is sufficiently strong to magnetize only the soft layer is applied in the direction opposite to the previous direction. Consequently, the soft and hard layers are magnetized in opposite directions. Since the element is uniaxial anisotropic, when the external field is removed, the magnetic direction of the soft layer remains stable under the influence of the hard layer. This external magnetic field is called "set magnetic field." Then, an external field which is opposite in direction is applied. When the external magnetic field exceeds the critical strength, the magnetic direction of the soft layer is inverted abruptly. This magnetic field is called "critical magnetic field." The inversion phenomenon occurs instantly as the magnetic wall of the soft layer moves like avalanche. Consequently, the magnetic directions of the soft and hard layers are the same as the original state. This external magnetic field is stronger than the critical magnetic field and called "reset magnetic field." This avalanche phenomenon is called "large Barkhausen jump." The speed of the magnetic inversion depends on only the large Barkhausen jump and is irrelevant to the external magnetic field.

Beside the wire-type magnetic element, a variety of other magnetic elements which show the same properties may be used for the invention. A magnetic element which has no composite layers, such as hard and soft layers, may cause a large Barkhausen jump, too. For example, a thin film making technique such as disclosed in Japanese patent application Kokai No. 4-218905 is used to form a thin-film magnetic body. The magnetic elements may by of the thick films or plates. Thus, the "magnetic elements capable of causing large Barkhausen jump" include all the magnetic elements which show the above characteristics.

An embodiment of the invention will now be described. In FIG. 1, a pulse signal generator comprises a wire-type magnetic element 10, a detection coil 20 wound around the magnetic element 10, a bar-like biasing permanent magnet 30 disposed in the vicinity of the magnetic element 10 to produce a biasing magnetic field capable of magnetizing the soft and hard layers of the magnetic element 10 in opposite directions, and a changing magnet 40 for changing the magnetic field in the magnetic element 10 when the object to be detected approaches the generator, and an auxiliary magnet 50 for forming a magnetic circuit between itself and the changing magnet 40.

The operation of the pulse signal generator will be described. The body to be detected 60 is a tooth of a gear, for example. When the gear tooth 60 is not in the vicinity of the changing magnet 40, the biasing magnetic field of the biasing magnet 30 is stronger than the magnetic field between the changing magnet 40 and the auxiliary magnet 50 with respect to the magnetic element 10 and magnetizes only the soft layer of the magnetic element 10 in the direction opposite to the hard layer. When the gear tooth 10 is in the vicinity of the changing magnet 40, the magnetic field between the changing magnet 40 and the auxiliary magnet 50 is stronger than the biasing magnetic field of the biasing magnet 30 with respect to the magnetic element 10 so that the magnetic field applied to the magnetic element 10 is inverted so as to align the magnetic directions of the hard and soft layers of the magnetic element 10.

The biasing magnet 30 is provided to magnetize only the soft layer of the magnetic element 10 in the direction opposite to the direction of the hard layer. In order to assure stable magnetization of almost the entire length of the magnetic element 10, the biasing magnet 30 is provided in parallel to the magnetic element 10 and has a length substantially the same as that of the magnetic element 10. The biasing magnet 30 is a permanent magnet having N and S poles directed to the opposite poles of the changing magnet 40 and the auxiliary magnet 50, respectively, as shown in FIG. 1. Since the external magnetic field of the biasing magnet 30 has elliptical curves across the opposite ends of the magnet and runs substantially parallel to the axial direction of the magnetic element 10, the magnetic element 10 is magnetized in a predetermined direction substantially in the entire length. It is noted that the strength of magnetization by the biasing magnet 30 is sufficient to magnetize only the soft layer of the magnetic element 10 in the direction opposite to that of the hard layer.

The changing magnet 40 is a thin plate type permanent magnet. The thickness is reduced to reduce the manufacturing cost. Unlike the biasing magnet 30, the changing magnet 40 is magnetized in the thicknesswise direction to provide magnetic poles on the upper and lower sides. Consequently, the demagnetizing field increases the internal magnetic field to increase the changing rate of the magnetic field. The magnetic element 10 is flanked by the changing and auxiliary magnets 40 and 50 at right angles so that a magnetic field is produced between the changing and auxiliary magnets 40 and 50 in the lengthwise direction of the magnetic element 10. The object to be detected 60 approaches the changing magnet 40 from the side of the S pole which is opposite to the side facing the auxiliary magnet 50.

Like the changing magnet 40, the auxiliary magnet 50 is a plate-like permanent magnet and is magnetized in the thicknesswise direction. The auxiliary magnet 50 has a length substantially equal to that of the changing magnet 40 and is provided in parallel to the changing magnet 40 so that parallel magnetic fields are established between them. The use of the auxiliary magnet 50 makes it possible to increase changes of the magnetic fields between itself and the changing magnet 40 and produce stable parallel magnetic fields between them. The auxiliary magnet 50 may be replaced by a magnetic body such as an iron body. The magnetic body cannot increase changes of the magnetic fields but produces stable parallel magnetic fields.

In general, a magnet has two kinds of magnetic fields; i.e., internal and external magnetic fields. However, the changing and auxiliary magnets 40 and 50 are so thin that the external magnetic fields are weak. In order to take out external magnetic fields from such thin magnets, a magnetic body is brought to the magnet. Thus, the object to be detected 60 is made from a magnetic material or provided with a magnetic body. When such a magnetic body approaches the changing magnet 40, more external magnetic fields are produced toward the object to be detected 60. In response to the production of external magnetic field in one pole, external magnetic fields of the same strength are produced at the opposite pole of the changing magnet 40. These external magnetic fields appear as parallel magnetic fields between the auxiliary magnet 50 and the changing magnet 40. An increase of the external magnetic field of the changing magnet 40 increases the external magnetic field of the auxiliary magnet 50, which in turn increases the magnetic field between the changing and auxiliary magnets 40 and 50. The external magnetic field of the auxiliary magnet 50 has a strength slightly less than that of the changing magnet 40.

Figure 2:
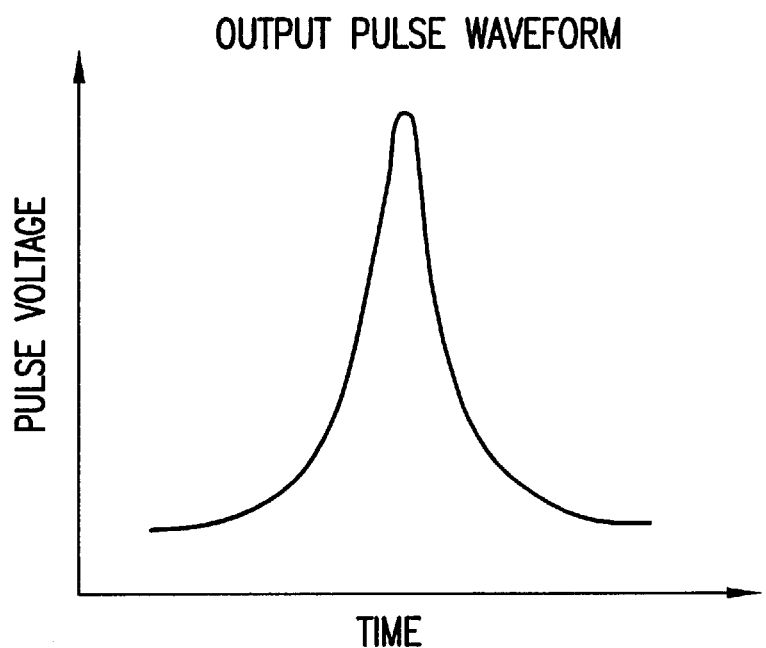
FIG. 2 is a graph showing the waveform of a pulse voltage generated by the pulse signal generator.

When the object 60 is not close to the changing magnet 40, the magnetic fields between the changing and auxiliary magnets 40 and 50 are weak, and the magnetic field of the biasing magnet 30 is dominant so that the soft layer of the magnetic element 10 is magnetized in the opposite direction to the hard layer, establishing a set condition. When the object 60 approaches the changing magnet 40, the magnetic fields between the changing and auxiliary magnets 40 and 50 become stronger than that of the biasing magnet 30 so that the magnetic field of the same direction as the hard layer is applied. As a result, the soft layer is inverted in the same direction as the hard layer, causing a large Barkhausen jump. Since the magnetic field of the soft layer changes at very high speeds, a pulse voltage is produced in the detection coil 20 by the electromagnetic induction. The waveform of the pulse voltage is shown in FIG. 2. The changing and auxiliary magnets 40 and 50 converts the change of the gear rotation speed to the rate of change of magnetic state of the magnetic element 10 by the biasing magnet 30. The length of the changing and auxiliary magnets 40 and 50 are adjusted to the size of the object 60 to control the resolution so that the device according to the invention is useful for objects of different sizes.

Figure 3:
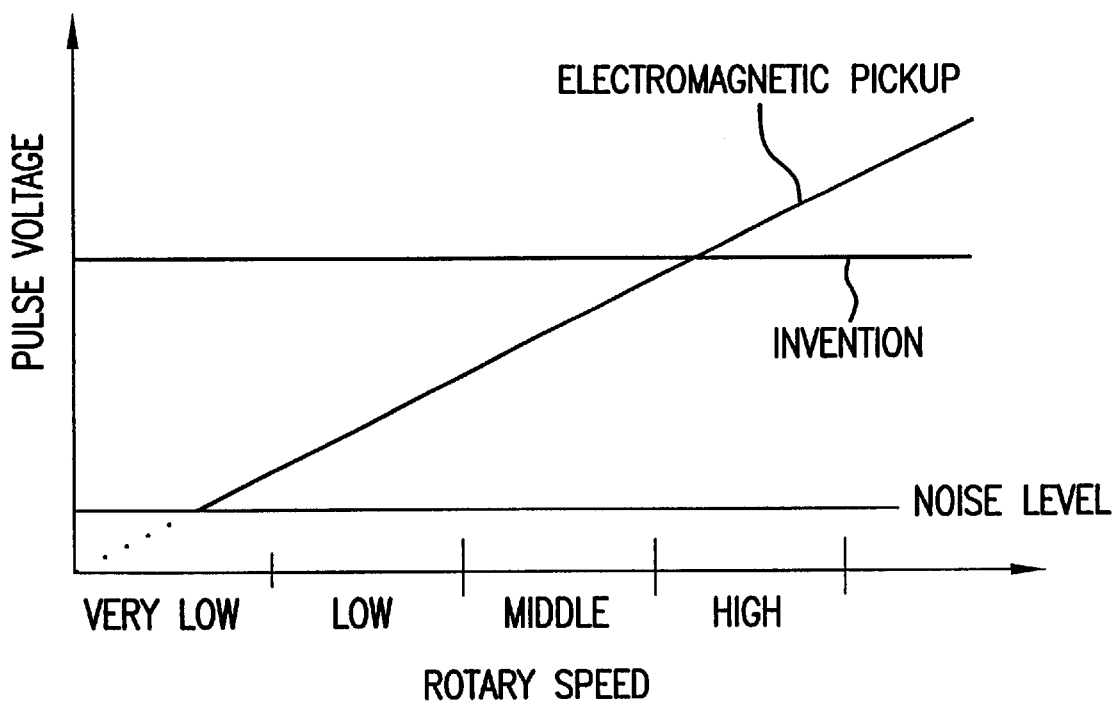
FIG. 3 is a graph showing a comparison between the pulse voltage by the pulse signal generator and the pulse voltage by the conventional electromagnetic pickup.

In this way, changes of the magnetic condition in the magnetic element 10 are detected by the detection coil 20 as pulse voltages by the electromagnetic induction. The presence or absence of a tooth of a gear causes a large Barkhausen jump regardless of the speed of the gear, thus producing a pulse signal without failure. Thus, even if the object 60 moves at very slow speeds, it is possible to make detection. The pulse signal keeps a constant voltage and phase relationship. A comparison between the pulse voltage according to the invention and the pulse voltage by the conventional electromagnetic pickup is shown in FIG. 3. The amplitude of the pulse voltage by the conventional electromagnetic pickup varies with the speed of the object to be detected 60. When the object moves at very low speeds, the pulse voltage can be below the noise level, whereas the amplitude of the pulse voltage by the invention keeps a predetermined level regardless of the speed of the object to be detected 60. The use of two magnets or changing and auxiliary magnets 40 and 50 assures detection of the object 60.

Figure 4:
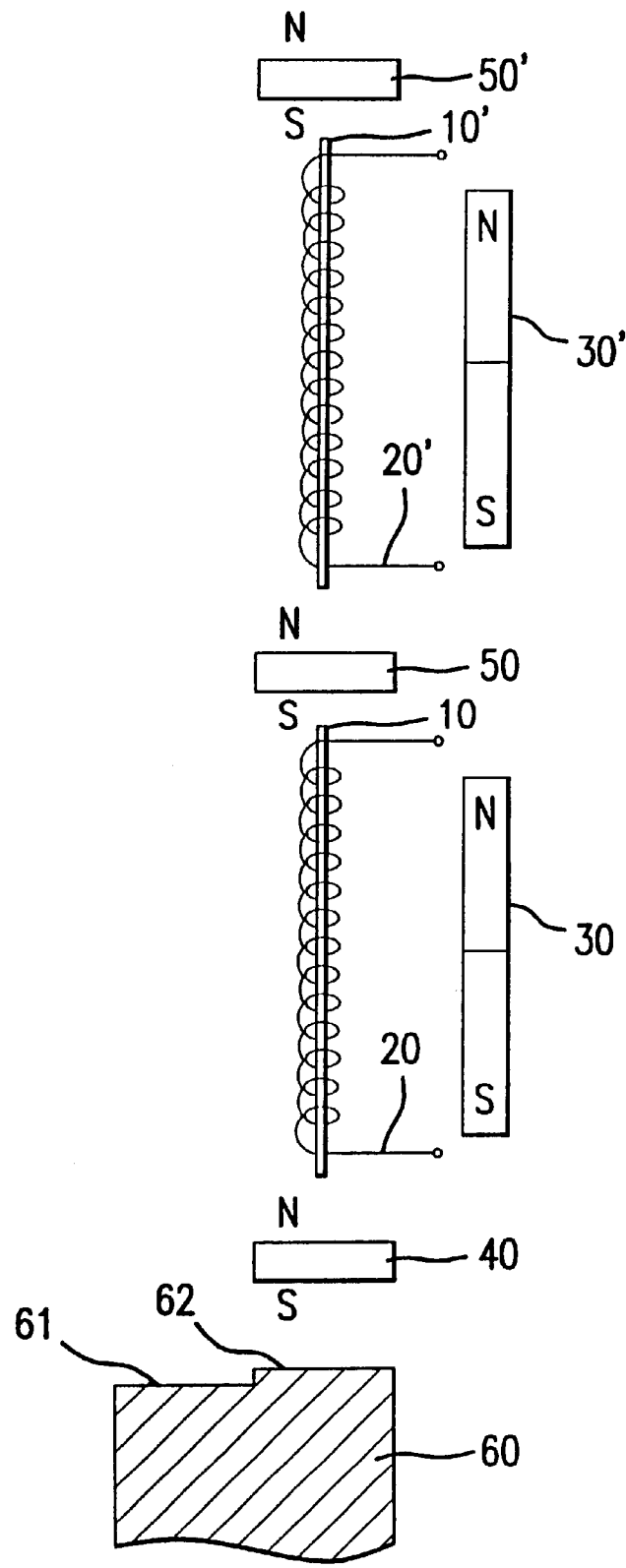
FIG. 4 is a schematic diagram showing a multiple stage structure of the pulse signal generator of FIG. 1.

FIG. 4 shows an application of the device of FIG. 1 to detect the object step by step. A new set of a magnetic element 10', a detection coil 20', a biasing magnet 30', and an auxiliary magnet 50' is added to the device of FIG. 1 to provide a double stage structure. More sets may be added to provide a multiple stage structure to detect the object step by step.

The presence of the object 60 increases the magnetic field between the changing magnet 40 and the object 60 so that an external field of the same strength is produced from the changing magnet 40 to the auxiliary magnet 50. In response, the external magnetic field from the auxiliary magnet 50 to the changing magnet 40 is changed, which in turn produces an external magnetic field of the same strength from auxiliary magnet 50 to the auxiliary magnet 50'. The magnetic field from the auxiliary magnet 50 to the auxiliary magnet 50' is slightly weaker than the magnetic field between the auxiliary and changing magnets 50 and 40. By detecting the weaker magnetic field between the auxiliary magnets 50 and 50' by means of the detection coil 20' and the magnetic element 10', it is possible to make a two-stage detection of the magnetic field. For example, where a step-like magnetic field is detected, the first weak magnetic field 61 and the next stronger magnetic field 62 are detected between the changing and auxiliary magnets 40 and 50 and auxiliary magnets 50 and 50', respectively. In this way, the magnetic field is detected more accurately.

FIG. 5 shows how to use the pulse signal generator of FIG. 1 to detect the teeth 71 of a rotary gear 70 which is made from a magnetic material and rotates in the direction of an arrow. Every time a tooth 71 passes the changing magnet 40, a pulse voltage is generated in the detection coil 20. The pulse voltage is processed to determine the rotary speed and angular position of the rotary gear 70.

Figure 6B:
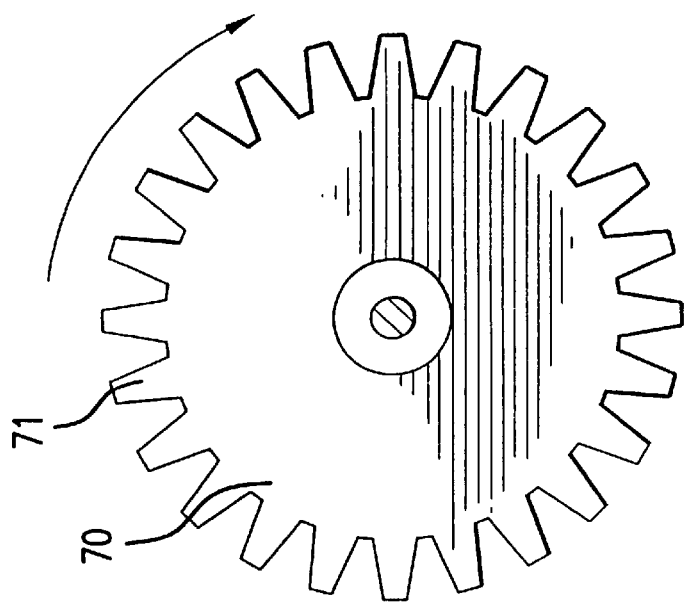
FIG. 6 is a schematic diagram showing another application of the pulse signal generator of FIG. 1.
Figure 6A:
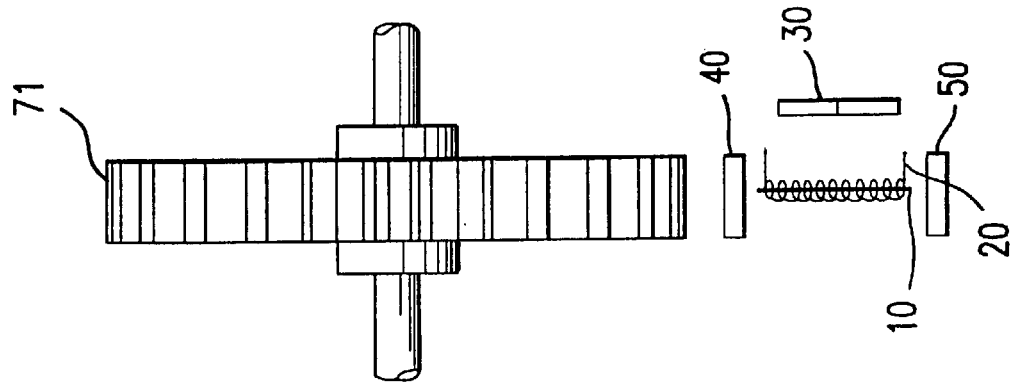

FIG. 6 shows another arrangement of the pulse signal generator of FIG. 1 to detect the teeth 71 of a gear 70 which is made from a magnetic material and rotates in the direction of an arrow. Every time a tooth 71 passes the changing magnet 40, a pulse voltage is generated in the detection coil 20. The pulse voltage is processed to determine the rotary speed and angular position of the rotary gear 70.

The wire-type magnetic element 10 may be replaced by a thin film magnetic element. In this case, the detection coil 20 may also be replaced by a planar detection coil. The magnetic element may be a single layer magnetic element.

The biasing permanent magnet may be replaced by an electromagnet. The detection coil may be replaced by a Hall element, MR element, or resonator circuit.

According to the invention, the very low speed of a straight or rotary movement may be detected. The resulting pulse signal keeps a constant voltage and phase relationship so that it neither be overwhelmed by noise nor need a limiter. The use of auxiliary and changing magnets assures the production of a magnetic field between them. It is easy to provide a high resolution and possible to provide a powerless type and explosion proof device. The device is so compact that it can replace the conventional pickup or Hall effect sensor.

As described above, the device can find more applications than the conventional electromagnetic pickup and Hall effect sensor. For example, it can be used for the detection of r.p.m. and angle of an automobile engine, automobile ABS, motor, crank shaft, acceleration sensor, such as an air bag sensor, PC keyboard, plugging detection of HID lamps, vibration sensor, swing sensor, and door open/close sensor.

What is claimed is:

1. A pulse signal generator, comprising:

a magnetic element capable of causing a large Barkhausen jump;

a detector for detecting a change of a magnetic field in said magnetic element;

a magnetic field source for magnetizing said magnetic element in a predetermined direction;

a thin plate permanent magnet magnetized in a thicknesswise direction thereof; and an auxiliary member of thin plate magnet or thin plate magnetic member provided such that said magnetic element is flanked between said permanent magnet and said auxiliary member and is in an external magnetic field between said permanent magnet and said auxiliary member;

said external magnetic field varying with movement of an object to be detected with respect to said permanent magnet to produce said change of said magnetic field in said magnetic element which is detected by said detector to produce a pulse.

2. A pulse signal generator according to claim 1, which further comprises:

a second auxiliary member provided to face said auxiliary member;

a second magnetic element provided in a magnetic field produced between said auxiliary member and said second auxiliary member and capable of causing a large Barkhausen jump;

a second magnetic field source for magnetizing said second magnetic element in a predetermined direction; and a second detector for detecting a change of magnetic field in said second magnetic element.

3. A pulse signal generator according to claim 2, wherein said second auxiliary member, second magnetic element, second magnetic field source, and second detector are repeated in a subsequent stage to provide a multiple stage structure.

4. A pulse signal generator according to one of claims 1–3, wherein said magnetic element is selected from the group consisting of a plate element, film element, and wire element.

* * * * *